(12) United States Patent
Easley et al.

(10) Patent No.: US 7,940,842 B2
(45) Date of Patent: May 10, 2011

(54) RECIPROCAL INDEX LOOKUP FOR BTSC COMPATIBLE COEFFICIENTS

(75) Inventors: Matthew F. Easley, Woodstock, GA (US); Roger Darr, Sugar Hill, GA (US); Matthew Barnhill, Duluth, GA (US)

(73) Assignee: THAT Corporation, Milford, MA (US)

( * ) Notice: Subject to any disclaimer, the term of this patent is extended or adjusted under 35 U.S.C. 154(b) by 136 days.

(21) Appl. No.: 12/134,568

(22) Filed: Jun. 6, 2008

(65) Prior Publication Data

US 2008/0317114 A1 Dec. 25, 2008

Related U.S. Application Data

(63) Continuation of application No. 10/407,041, filed on Apr. 4, 2003, now Pat. No. 7,397,850, which is a continuation-in-part of application No. 09/506,989, filed on Feb. 18, 2000, now Pat. No. 6,588,867.

(60) Provisional application No. 60/370,064, filed on Apr. 4, 2002, provisional application No. 60/120,608, filed on Feb. 18, 1999.

(51) Int. Cl.
*H04B 1/66* (2006.01)
(52) U.S. Cl. .................. 375/240; 375/341
(58) Field of Classification Search .................. 375/240, 375/262, 229, 232, 341
See application file for complete search history.

(56) References Cited

U.S. PATENT DOCUMENTS

| | | | |
|---|---|---|---|
| 4,472,830 A * | 9/1984 | Nagai | 381/2 |
| 4,602,380 A * | 7/1986 | Stebbings | 381/13 |
| 4,760,602 A | 7/1988 | Gibson et al. | |
| 4,817,151 A * | 3/1989 | Bod et al. | 381/13 |
| 4,944,010 A * | 7/1990 | Ishiguro et al. | 381/4 |
| 5,091,957 A | 2/1992 | Anderson et al. | |
| 5,148,275 A | 9/1992 | Blatter et al. | |
| 5,315,660 A * | 5/1994 | Anderson et al. | 381/13 |
| 5,337,196 A * | 8/1994 | Kim | 386/39 |
| 5,373,562 A | 12/1994 | Albean | |
| 5,377,272 A | 12/1994 | Albean | |
| 5,526,284 A * | 6/1996 | Mankovitz | 455/66.1 |
| 5,561,849 A * | 10/1996 | Mankovitz | 455/45 |
| 5,612,789 A * | 3/1997 | Nagura | 386/65 |
| 5,684,878 A * | 11/1997 | Nagura | 381/4 |

(Continued)

OTHER PUBLICATIONS

Crochiere, R.E., et al., "Multirate Digital Signal Processing", Prentice-Hall, Inc., Englewood Cliffs, NJ 07632, 1983, 3pp.

*Primary Examiner* — Emmanuel Bayard
(74) *Attorney, Agent, or Firm* — McDermott Will & Emery LLP (57) ABSTRACT

An algorithm calculates spectral compression/expansion filter coefficients using a value proportional to a reciprocal of a feedback/feedforward signal and stores the coefficients to a lookup table. The lookup table is indexed by a pre selected set of coefficient bits to generate a filter coefficient function. A first portion of the lookup table stores a plurality of discrete values at index points of a line segment corresponding to a filter coefficient function approximation, so as to generate an initial discrete value corresponding to the filter coefficient function at a value of the high order bits and a second portion stores a plurality of slope values, which indicates a slope of the filter coefficient function. A linear circuit interpolates/decimates an approximation of the compression/expansion filter coefficient function based on the slope value, the initial discrete value and a preselected set of low order bits of the reciprocal value.

24 Claims, 8 Drawing Sheets

U.S. PATENT DOCUMENTS

| | | |
|---|---|---|
| 5,744,742 A | 4/1998 | Lindemann et al. |
| 5,808,671 A | 9/1998 | Maycock et al. |
| 5,987,141 A | 11/1999 | Hoover |
| 6,118,879 A * | 9/2000 | Hanna ............... 381/106 |
| 6,259,482 B1 | 7/2001 | Easley et al. |
| 6,327,391 B1 | 12/2001 | Ohnishi et al. |
| 6,351,631 B1 * | 2/2002 | Noeske et al. ............. 455/260 |
| 6,588,867 B1 | 7/2003 | Darr |
| RE40,836 E * | 7/2009 | Mankovitz ............. 455/66.1 |
| 2002/0167423 A1 | 11/2002 | Vierthaler et al. |
| 2003/0161477 A1 | 8/2003 | Wu et al. |
| 2007/0016316 A1 | 1/2007 | Hanna |

* cited by examiner

FIG. 7
BTSC Expander
(plus decimation filter)

7,940,842 B2

RECIPROCAL INDEX LOOKUP FOR BTSC COMPATIBLE COEFFICIENTS

CROSS-REFERENCE TO RELATED APPLICATION

The present application is a continuation of U.S. application Ser. No. 10/407,041 filed on Apr. 4, 2003, which in turn (1) claims the benefit of priority to U.S. Application No. 60/370,064 filed on Apr. 4, 2002, and (2) is a continuation-in-part of co-pending patent application Ser. No. 09/506,989 filed on Feb. 18, 2000, which in turn claims priority on provisional patent application Ser. No. 60/120,608 filed Feb. 18, 1999. The disclosures of all such applications are incorporated herein by reference in their entirety.

BACKGROUND

1. Field of the Invention

The present invention relates to audio companding systems and, more specifically, to an apparatus for digitally implementing the compression and expansion functions in a BTSC decoder and encoder.

2. Description of the Prior Art

BTSC-compatible encoders and decoders are used to encode and decode stereo audio signals into NTSC television compatible audio signals. Existing systems typically use an analog approach. The analog approach is environmentally sensitive and, in the case of the encoder, requires extra circuitry to be compatible with digital television systems.

Existing digital BTSC encoder and decoder implementations require complex circuitry to facilitate determination of BTSC variable spectral preemphasis and deemphasis filter coefficients. The encoder implements the variable spectral preemphasis function. The decoder implements the variable spectral deemphasis function. In the case of the encoder, a feedback function is utilized to calculate the coefficients. In the case of the decoder, a feedforward function is utilized to calculate the coefficients. The transfer function of the decoder variable de-emphasis filter is simply the inverse of the encoder preemphasis filter. The filter coefficients are calculated in the same manner for both the encoder and decoder. Such circuitry is made complex because the feedback (feedforward) functions used to calculate the coefficients tend to exhibit a sharp bend, thereby causing the function to behave in a nonlinear fashion. Such non-linearity reduces the precision of interpolated coefficients. Therefore, there is a need for a circuit that employs a nearly linear aspect of the BTSC feedback (feedforward) function to facilitate more precise interpolation of BTSC filter coefficients.

SUMMARY

In the following, where a component that has applicability in a compressor and in an expander is described, the compressor-related descriptor will be used followed by the expansion-related complementary descriptor in parenthesis.

One aspect is a method of calculating a variable spectral compression (expansion) filter coefficient in a BTSC compatible stereo encoder (decoder) from a feedback (feedforward) variable. A reciprocal value that is proportional to a reciprocal of the feedback (feedforward) variable is calculated. A lookup table is indexed using a preselected set of bits of the reciprocal value to generate at least one parameter of the filter coefficient function. An approximation of the compression filter coefficient is linearly interpolated based on the, at least, one parameter of the filter coefficient function.

In another aspect, a method of calculating a variable spectral compression (expansion) filter coefficient in a BTSC compatible stereo encoder (decoder) from a feedback (feedforward) variable. A reciprocal value that is proportional to a reciprocal of the feedback (feedforward) variable is calculated. A lookup table is indexed using a preselected set of high order bits of the reciprocal value. A first portion of the lookup table stores a plurality of discrete values at index points of a line segment corresponding to a filter coefficient function approximation. The first portion of the lookup table generates an initial discrete value corresponding to the filter coefficient function at a value of the high order bits. A second portion of the lookup table stores a plurality of slope values with each slope value indicating a slope of a line segment of the filter coefficient function. The second portion of the lookup table generates a slope value of a line segment corresponding to the filter coefficient function at the value of the high order bits. An approximation of the compression filter coefficient is linearly interpolated based on the slope value, the initial discrete value and a preselected set of low order bits of the reciprocal value.

In yet another aspect, an apparatus that includes circuitry that calculates a variable spectral compression (expansion) filter coefficient in a BTSC compatible stereo encoder (decoder) from a feedback (feedforward) variable. The apparatus includes a reciprocal value circuit that calculates a reciprocal value that is proportional to a reciprocal value of the feedback (feedforward) variable. The apparatus also includes a lookup table that is indeXed by a preselected set of high order bits of the reciprocal value, wherein a first portion of the lookup table stor,-,6 a plurality of discrete values at index points of a line segment corresponding to a filter coefficient function approximation, so as to generate an initial discrete value corresponding to the filter coefficient function at a value of the high order bits, and wherein a second portion of the lookup table stores a plurality of slope values, each slope value indicating a slope of a line segment of the filter coefficient function, so as to generate a slope value of a line segment corresponding to the filter coefficient function at the value of the high order bits. A linear interpolation circuit interpolates an approximation of the compression filter coefficient based on the slope value, the initial discrete value and a preselected set of low order bits of the reciprocal value.

In yet another aspect, an apparatus is described for digitally implementing the entire expander portion of a BTSC decoder. This implementation includes the variable spectral expander, two feedforward loops, a decimator and fixed deemphais functions. The apparatus utilizes digital models of the BTSC expander continuous time transfer functions. The circuitry also includes decimation and sampling circuitry that allows the implementation to utilize a variety or sampling rates.

These and other aspects of the invention will become apparent from the following description of the preferred embodiments taken in conjunction with the following drawings. Many variations and modifications of the invention may be effected without departing from the spirit and scope of the novel concepts of the disclosure.

DETAILED DESCRIPTION

Referring to the drawings, like numbers indicate like parts throughout the views. As used herein, a digital BTSC-compatible stereo television difference signal is one component of a digital stereo audio signal that can be decoded (expanded) by a decoder that complies with the BTSC stereo television standard. The difference signal begins simply as the difference between the left and right audio signals of a stereo audio source. A BTSC stereo encoder then compresses it. The input to the expander section of a BTSC decoder is this compressed difference signal. The expander restores the original difference signal. One skilled in the art will appreciate that the decoder typically performs functions that are the inverse of corresponding functions at an encoder. One skilled in the art will also appreciate that the compressor and expander functions of a BTSC encoder and decoder are also applied to the Second Audio Program (SAP) channel in a BTSC audio system.

Figure 1:
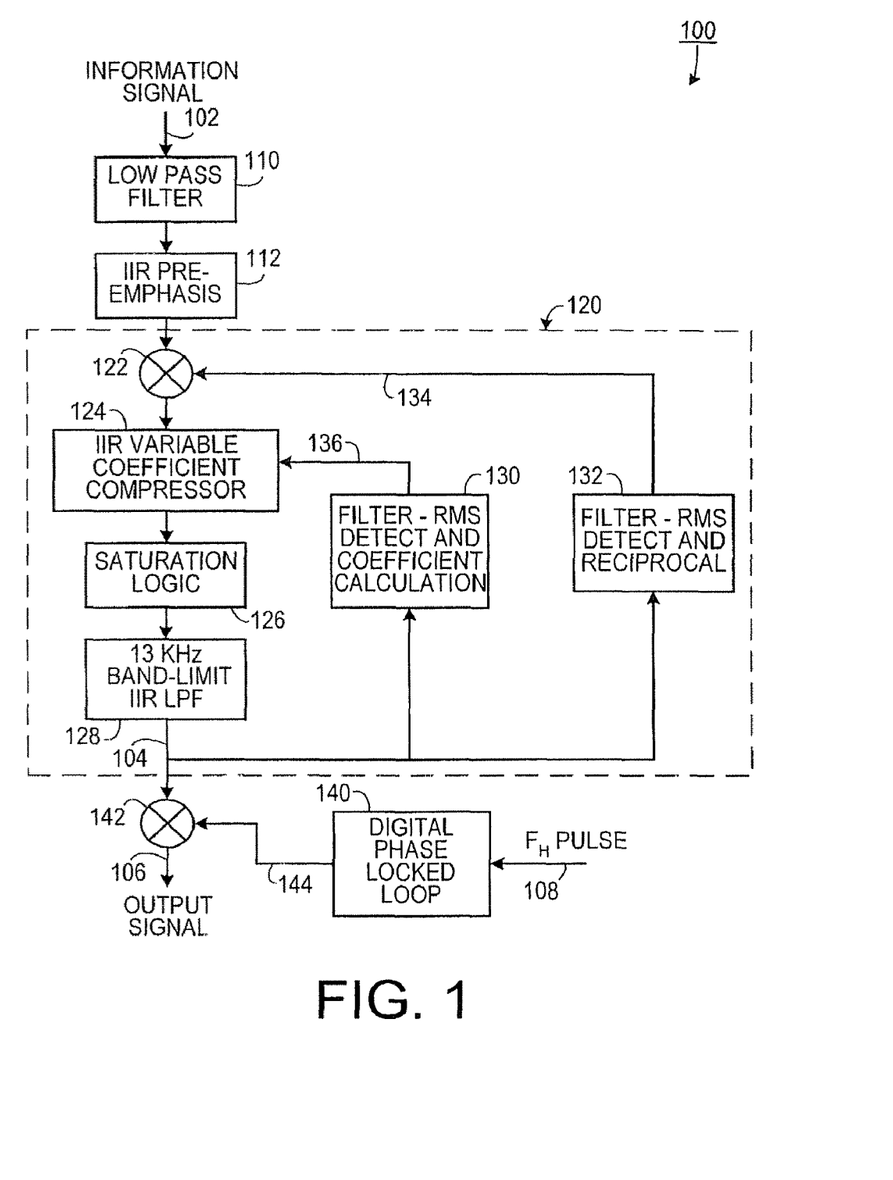
FIG. 1 is a schematic diagram of the compressor portion of a BTSC-compatible encoder according to one embodiment of the invention.

As shown in FIG. 1, the BTSC-compatible encoder is an application specific integrated circuit 100 in which a low pass filter 110 receives a digital representation 102 of an audio signal having a sample rate of Fs. The audio signal could include difference left minus right components or it could include a SAP component, depending upon the specific application. The low pass filter 110 generates a corresponding second digital signal having a pseudo-interpolated sampling rate of 4Fs. A digital infinite impulse response pre-emphasis filter 112 generates a pre-emphasized output signal corresponding to the second digital signal, in accordance with the BTSC standard. A digital signal compressor 120 receives the pre-emphasized output signal and generates a compressed digital difference signal 104.

Figure 3:
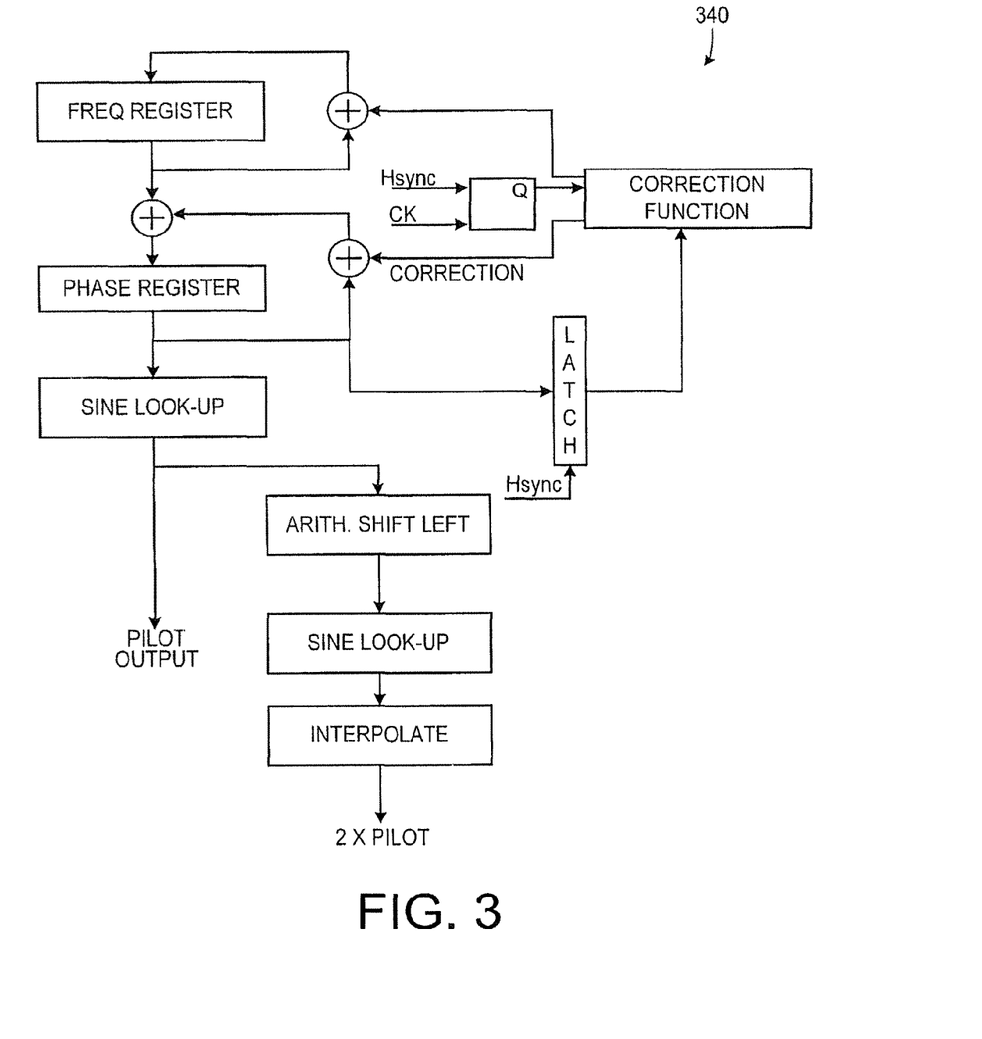
FIG. 3 is a schematic diagram of a digital phase locked loop employed in the embodiment of FIG. 1.

A digital phase locked loop 140 that is responsive to a video sync pulse 108 having a sync pulse frequency (FH) generates a third digital signal 144 corresponding to a sinusoid having a frequency equal to twice the sync pulse frequency and a having a sampling frequency equal to 4Fs. A first digital multiplier 142 multiplies the compressed digital signal 104 by the third digital signal 144 to generate a digital BTSC-compatible stereo television difference signal 106. Multiplier 142 facilitates amplitude modulation of carrier signal 144 with signal 104. One embodiment 340 of the digital phase locked loop 140 is shown in FIG. 3.

Figure 2:
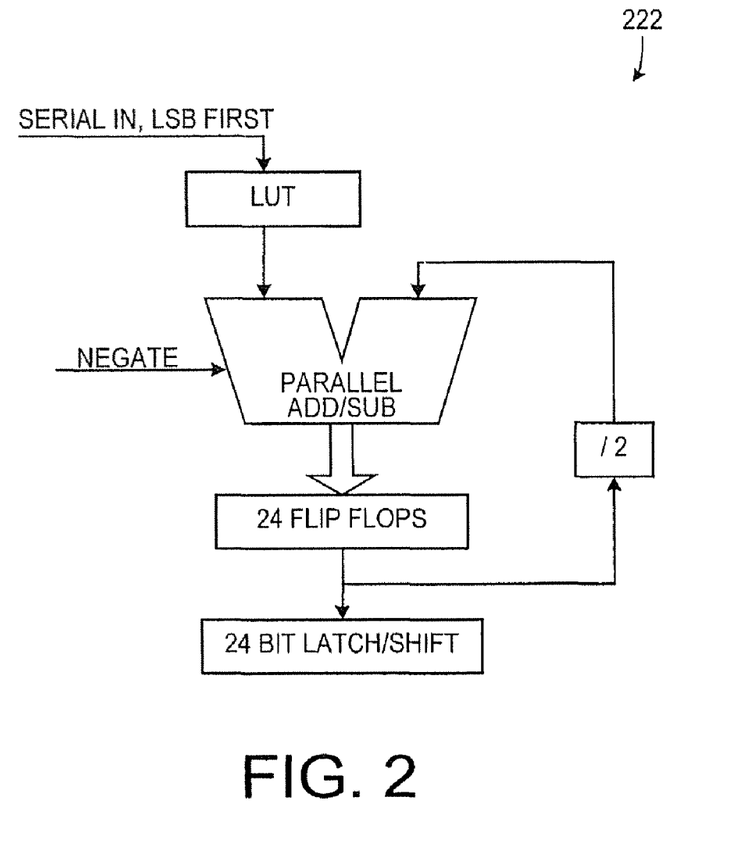
FIG. 2 is a schematic diagram of a serial multiplier employed in the embodiment of FIG. 1.

Returning to FIG. 1, the digital signal compressor 120 includes a second digital multiplier 122 that multiplies the pre-emphasized output signal by a first feedback signal 134, thereby generating a digital feedback-multiplied signal. (The multiplier could be a serial multiplier 222 of the type shown in FIG. 2.) An infinite impulse response variable coefficient compressor 124, that is responsive to the feedback-multiplied signal and responsive to a digital coefficient feedback signal 136, generates a digital dynamic range-limited signal corresponding to the feedback-multiplied signal limited to a predetermined dynamic range. Essentially, the infinite impulse response variable coefficient compressor 124 narrows the dynamic range of the feedback-multiplied signal. A saturation logic circuit 126 generates a digital amplitude-limited signal corresponding to the digital dynamic range-limited signal limited to a predetermined amplitude range. A digital band-limited infinite impulse response low pass filter 128, that is responsive to the amplitude-limited signal, generates a digital band-limited signal corresponding to the amplitude-limited signal that serves as the compressed digital difference signal 104. In the disclosed embodiment, the digital band-limited infinite impulse response low pass filter 128 cuts off signals above 13 KHz, thereby eliminating certain harmonics. Although various cutoff frequencies may be chosen for a particular application, the cutoff of 13 KHz was chosen for a low cost subscriber implementation. A cutoff of 15 KHz could be used for a headend application or a higher fidelity subscriber application. The cutoff frequency for a SAP implementation would typically be 10 KHz.

Figure 4:
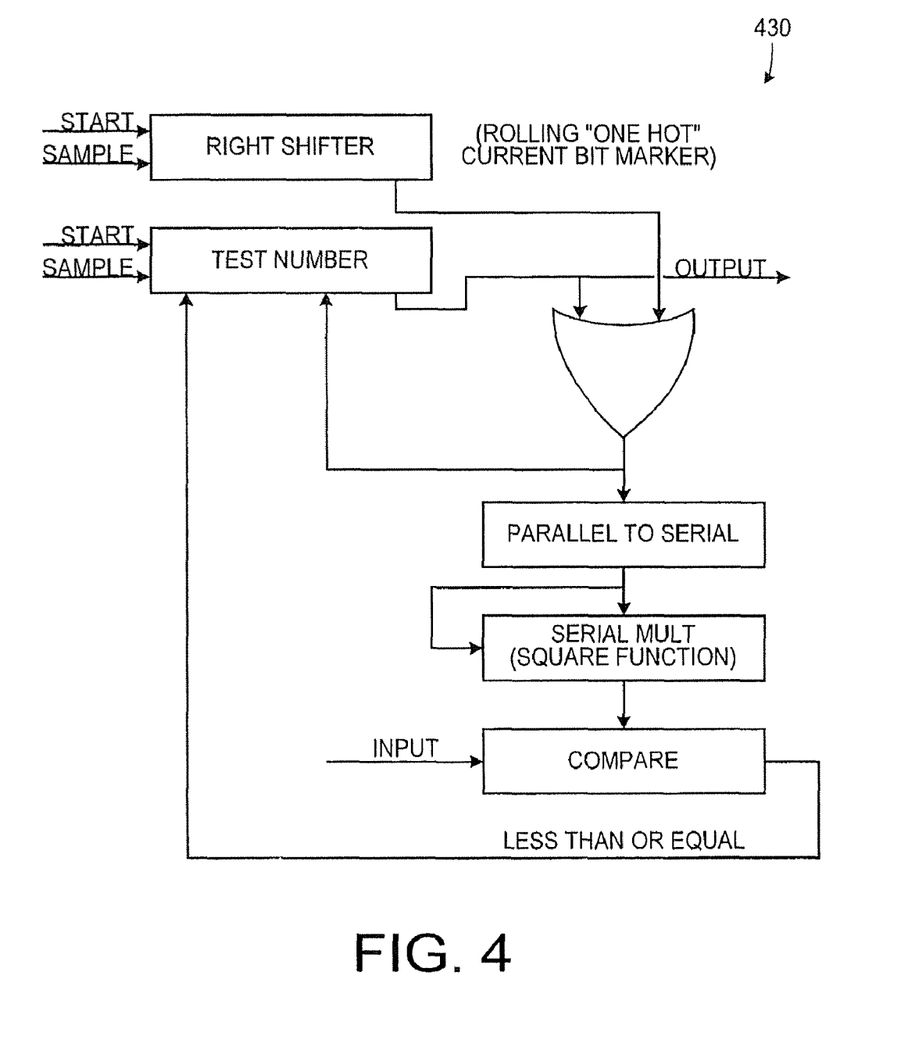
FIG. 4 is a schematic diagram of a positive square root finder employed in the embodiment of FIG. 1.
Figure 5:
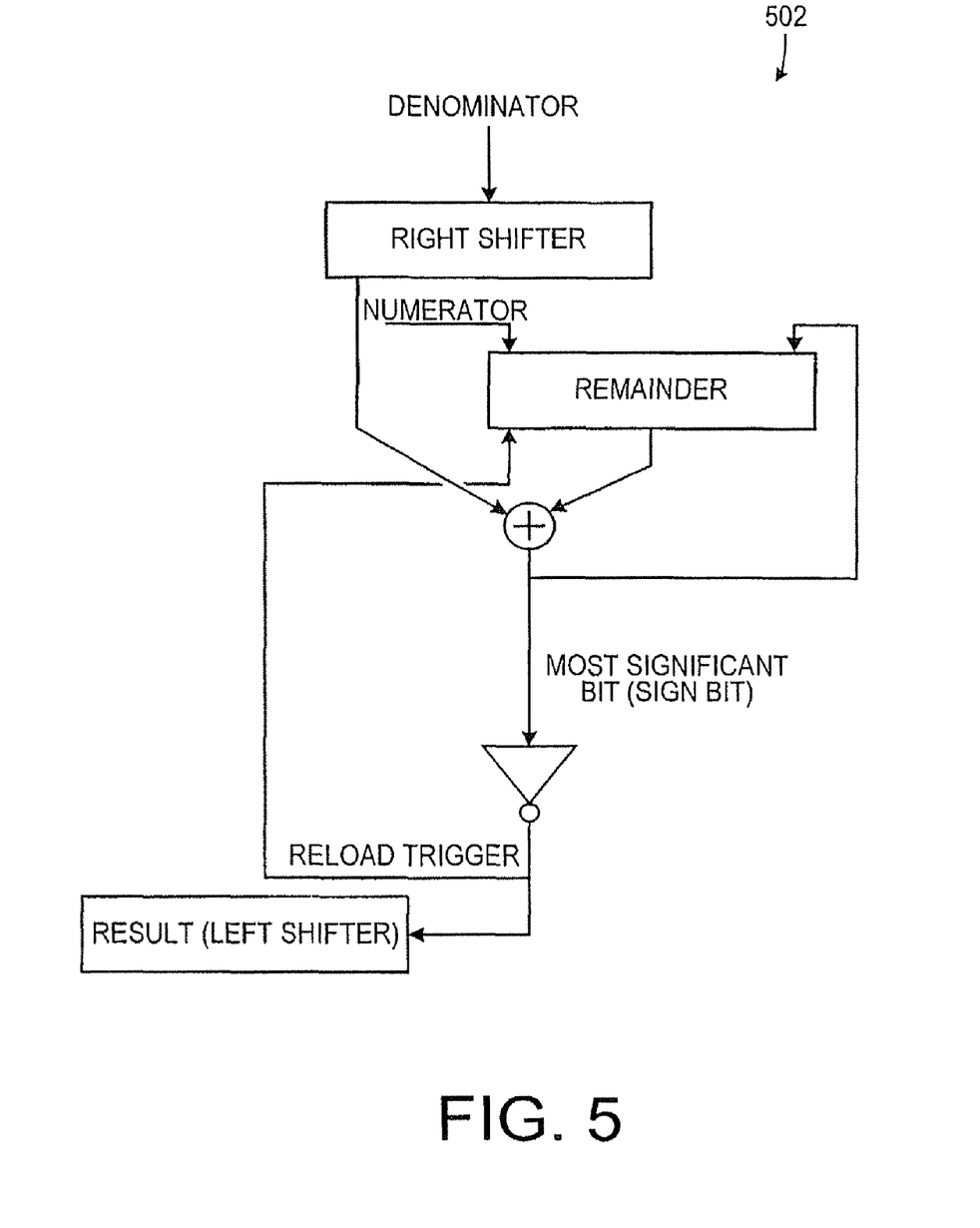
FIG. 5 is a schematic diagram of a serial divider employed in the embodiment of FIG. 1.

A first feedback circuit 130, that is responsive to the band-limited signal, includes a root-mean-squared (RMS) level detector and generates the first feedback signal indicative of an amplitude of the band-limited signal (In one embodiment, the RMS level detector includes a positive square root finder 430, as shown in FIG. 4.) The first feedback circuit 130 also includes a band pass filter that passes signals in a relatively higher frequency range. In the disclosed embodiment, this filter passes frequencies around 11 KHz. A second feedback circuit 132, responsive to the band-limited signal, generates the coefficient feedback signal based on the band-limited signal. The second feedback circuit 132 also includes an RMS level detector and a band pass filter that passes lower frequencies. In the disclosed embodiment, this frequency range is between approximately 30 Hz and 3000 Hz. The second feedback circuit 132 also employs a divider 502 (as shown in FIG. 5) to generate a reciprocal signal value.

Figure 6A:
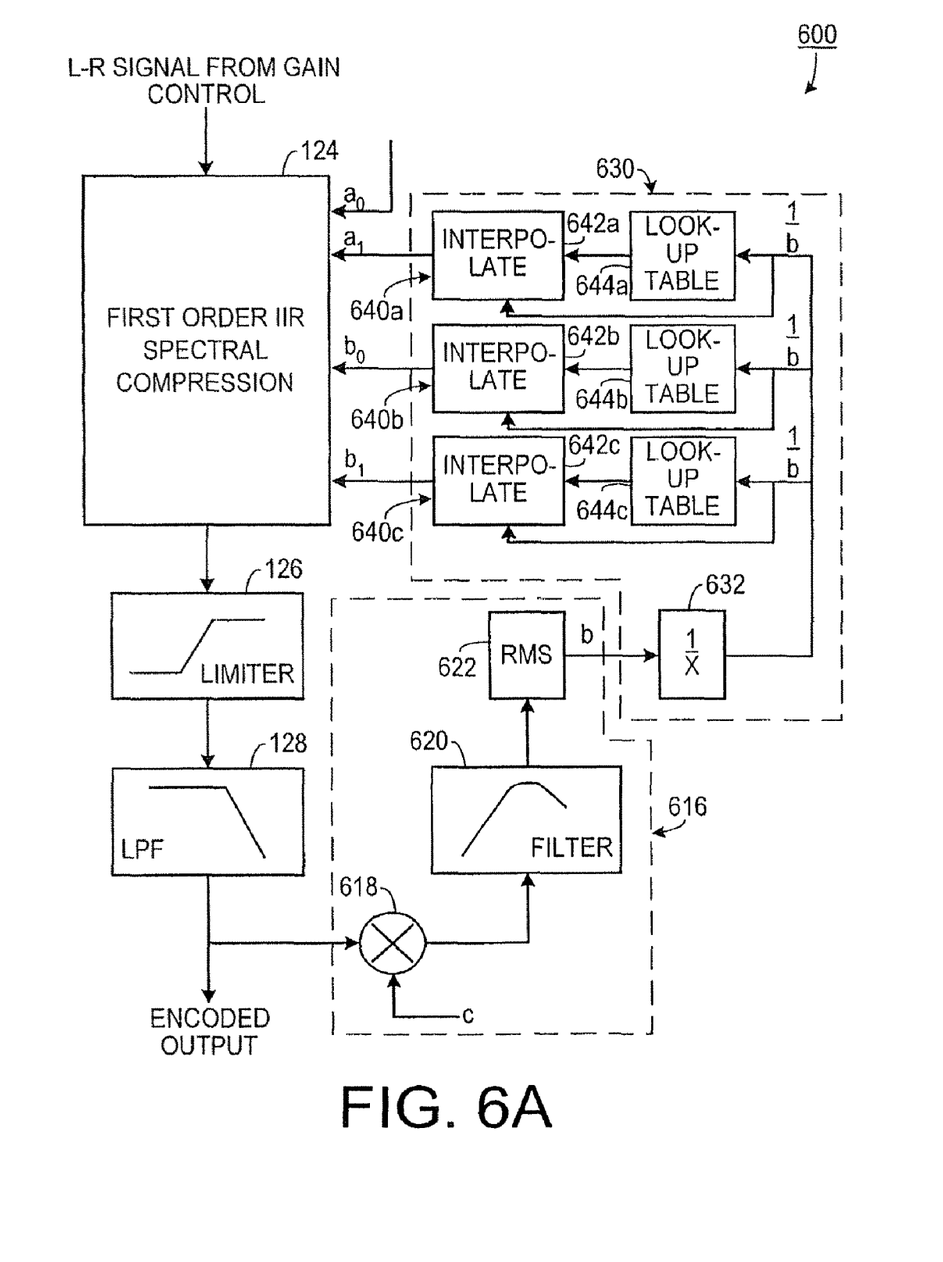
FIG. 6A is a schematic diagram of a circuit that generates filter coefficients, in accordance with one aspect of the invention.

The digital coefficient feedback signal 136 may actually comprise several variable spectral compression filter coefficients. As shown in FIG. 6A, in one illustrative embodiment, a coefficient calculating circuit 630 calculates the filter coefficients $a_0$, $a_1$, $b_0$, and $b_1$ from a feedback variable that was output by the variable coefficient compressor 124, which in one embodiment is a first order Infinite Impulse Response (IIR) filter. Each filter coefficient $a_1$, $b_0$, and $b_1$ is calculated by a different approximating circuit 640a (for $a_1$), 640b (for $b_0$) and 640c (for $b_1$). (In this embodiment, the value for $a_0$ is set at a constant value of "1.") While for this embodiment the IIR requires four filter coefficients, it will be understood that other IIR's could require a different number of filter coefficients.

The coefficient calculating circuit 630 includes a reciprocal value circuit 632 that calculates a reciprocal value that is proportional to a reciprocal value of the feedback variable. A lookup table 644 is indexed by the high order bits of the reciprocal value. A first portion of the lookup table 644 stores a plurality of discrete values at index points of a line segment corresponding to a filter coefficient function approximation. The first portion of the lookup table 644 generates an initial discrete value corresponding to the filter coefficient function at a value of the high order bits. A second portion of the lookup table 644 stores a plurality of slope values, wherein each slope value indicates a slope of a line segment of the filter coefficient function. The second portion of the lookup table 644 generates a slope value of the line segment corresponding to the filter coefficient function at the value of the high order bits. It will be appreciated by those skilled in the art that the lookup table 644 could include several physically separate lookup tables with each indexed by the high order bits.

Because of the nature of the coefficient functions, the coefficient functions of the reciprocal of the feedback variable tend to behave more linearly than the coefficient functions of the non-reciprocal feedback variable. Therefore, using the reciprocal of the feedback variable to index the lookup table 642 allows for the use of linear interpolation to approximate the filter coefficients $a_0$, $a_1$, $b_0$, and $b_1$.

Figure 6B:
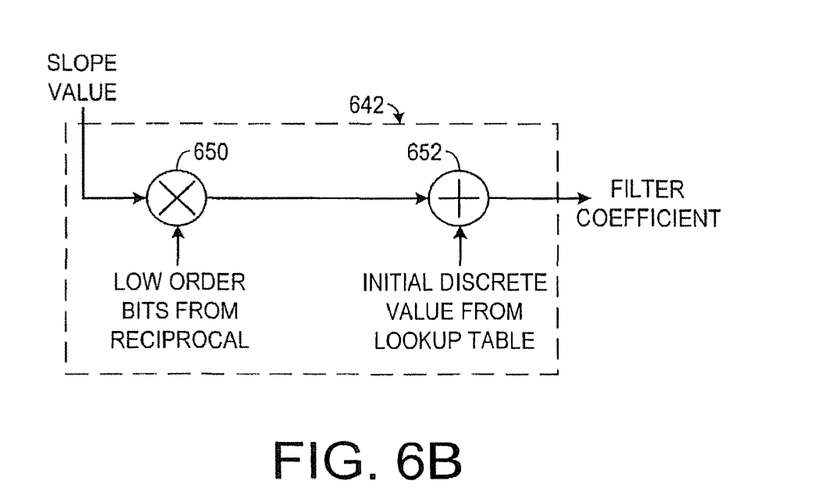
FIG. 6B is a schematic diagram of an interpolation circuit.

A linear interpolation circuit 642 interpolates an approximation of the compression filter coefficient based on the slope value, the initial discrete value and a preselected set of low order bits of the reciprocal value. In one embodiment, as shown in FIG. 6B, the interpolation circuit 642 includes a multiplier 650 that multiplies the slope value by the value of the low order bits of the reciprocal value to generate a product value. An adder 652 adds the initial discrete value from the lookup table 644 to the product value, thereby generating an approximation of the compression filter coefficient.

Returning to FIG. 6A, a feedback signal conditioning circuit 616 conditions the signal for use by the coefficient calculating circuit 630. The signal conditioning circuit 616 includes a multiplier 618 that multiplies the encoded output of the low pass filter 128 by a scaling constant c to generate a scaled version of the encoded output. A band pass filter 620 weighted to high frequencies generates a filtered signal from the scaled signal. A root-mean-squared 622 circuit generates a root-mean-squared version of the output of the conditioning circuit 616. The root-mean-squared version of the output of the conditioning circuit 616 is then transmitted to the coefficient calculating circuit 630.

Figure 6C:
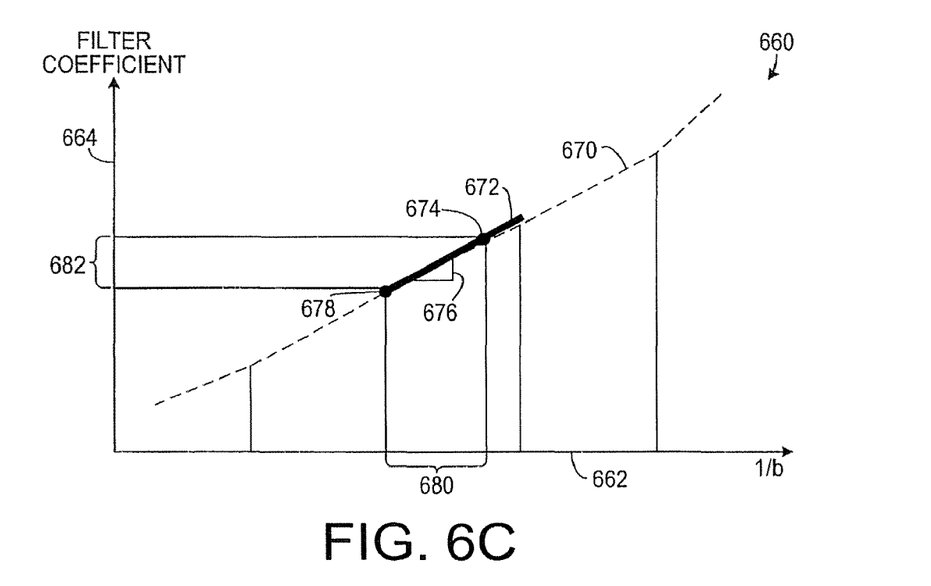
FIG. 6C is a graph showing one implementation of linear interpolation.

One illustrative implementation of linear interpolation that may be used with the invention is shown in FIG. 6C. As shown in FIG. 6C, the coefficient function 670 may be plotted on a graph 660 having a 1/b axis 662 and a filter coefficient axis 664. The high order bits of 1/b are used to index the lookup table to retrieve two parameters of a line segment 672 that locally approximates the filter coefficient function 670. The retrieved parameters include an initial value 678 of the line segment 672 and the slope 676 of the line segment. The low order bits 680 of 1/b times the slope 676 give a filter coefficient axis 664 offset 682 from the initial value 678 to provide the approximate value 674 of the filter coefficient.

The overall design strategy of the circuit disclosed includes: limiting output bandwidth to 13 KHz to simplify filter requirements; employing linear interpolation to two times the input sampling frequency before pre-emphasis; employing linear interpolation to four times the input sampling frequency, Fs, before bandwidth-limit filter; allowing the bandwidth limit filter to remove residual images from the interpolation; using the digital phase locked loop 140 to create sinusoidal $F_H$ and $2 F_H$ at a sampling rate of 4 Fs; and modulating the left and right components of the audio signal by $2 F_H$ and inserting the $F_H$ pilot digitally. All of this may be embodied on an application specific integrated circuit to reduce costs.

It will be appreciated that principles similar to those described above are applicable to a decoder as well as an encoder, as low cost filter components are beneficial in a decoder as well as an encoder. U.S. Pat. No. 6,259,482 to Easley, et. al. ("the '482 patent"), which is hereby incorporated by reference herein in its entirety, describes methods and system for digitally encoding stereo audio into a BTSC signal. Specifically, column 11 line 26 thru column 18 line 18 of the '482 patent describe a way to digitally implement the compressor portion of a BTSC encoder. Column 13 line 40 thru column 14 line 30, of the '482 patent, provides a description of an alternative technique for calculating the variable spectral compressor coefficients. This technique does not exploit the linear coefficient function obtained by taking the reciprocal of the feedback value. As described in the provisional U.S. patent application 60/370,064, which has been referenced herein and is incorporated by reference herein in its entirety, a decoder used to decode a BTSC signal to produce an uncompressed stereo audio signal implements method steps that are complementary to corresponding steps in a corresponding encoder.

Figure 7:
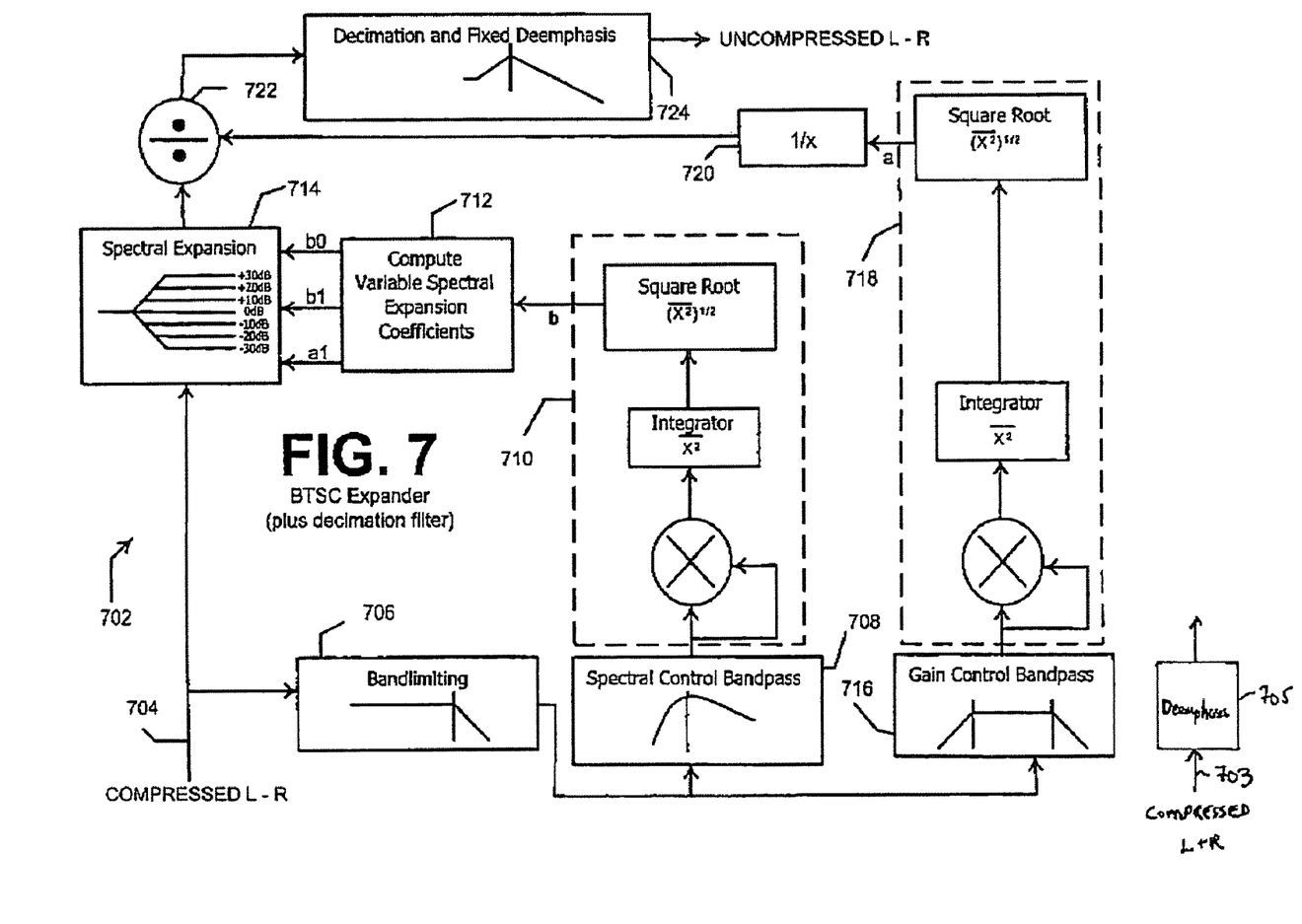
FIG. 7 illustrates a block diagram of the expander portion of a BTSC-compatible encoder according to one embodiment of the invention.

Turning now to FIG. 7, a block diagram of the expander portion of a BTSC decoder 702 is shown. A compressed L−R. BTSC compatible signal 704 is input to the io decoder 702. Signal 704 is the equivalent of signal 104 in FIG. 1. It will be appreciated that signal 704 is typically a demodulated signal, the demodulation operation offsetting the amplitude modulation performed by multiplier 142 of FIG. 1. In this way the compressor and expander can be visualized as cascaded respectively with the feedback paths of the encoder and the feedforward paths of the decoder processing the same signal. Part of the input signal 702 is routed to bandlimiting lowpass filter 706 so as to limit the response of the feedforward loops to only those spectral components that are present in the compressed difference channel. The output of lowpass filter 706 is provided to spectral control bandpass filter 708, which attenuates frequencies that are not preemphasized, based on a predetermined preemphasis scheme. Spectral control bandpass filter 708 is identical to that implemented in the encoder, or compressor. The output from spectral control bandpass filter 708 is provided to RMS converter 710, which generates the RMS value of the signal that passes through bandpass filter 708. Thus, the output of RMS converter 710 is the RMS value of the portion of the input signal for which preemphasis was applied at an encoder, as described in the '482 patent at col. 16, line 23-col. 17, line 40. This preemphasis RMS value is used to determine spectral expansion coefficients at spectral expansion coefficient generator 712. These coefficients, shown as a1, b0 and b1 in the figure, are used to expand signal 704 so that its spectral balance matches that of the signal before compression at an encoder. It will be appreciated that the transfer function of the spectral expander in the decoder is the reciprocal of the transfer function of the spectral compressor in the encoder; the computation of coefficients is similar. The expander numerator coefficients are the compressor denominator coefficients, and likewise, the expander denominator coefficients are the compressor numerator coefficients.

Spectral expander 714 uses coefficients generated by coefficient generator 712 to expand/decode the compressed signal 704. Each set of coefficients corresponds to a specific level of spectral expansion.

Following the application of the coefficients to the digital signal, the conditioned digital from expander 714 is combined with a signal proportional to the reciprocal of the bandlimited portion of signal 704. After signal 704 passes through bandlimiter 706, the bandlimited signal is passed through bandpass filter 716. Then, RMS converter 718 generates the RMS value of the signal from bandpass filter 716 and passes said RMS signal to reciprocal calculation block 720. The output of the reciprocal calculation block 720 is divided from the output of spectral expander 714 by divider 722. The signal output from divider 722 is then processed through decimator 724. A digital embodiment of this implementation for an encoder is described in column 15 line 1 through column 16 line 22 of the '482 patent. This present decoder embodiment is identical except for the fact that the decoder multiplies the signal by the reciprocal value. It will be appreciated that dividing the signal by the reciprocal of the feedforward value in the decoder offsets the effect of multiplying by the reciprocal of the feedback value in the encoder.

Decimator 724, which is calibrated to a predetermined sample rate, decimates the 15 signal to a lower sample rate so that it can be output to an inexpensive audio digital to analog converter. While decimating, the decimator filter 724 also performs fixed de-emphasis to the signal. The fixed deemphasis transfer function is typically the reciprocal of the fixed preemphasis transfer function used in the decoder. A digital implementation of the fixed preemphasis filter is described in column 12 line 31 through column 13 line 2 of the '482 patent.

It will be appreciated that the decoder, or expander 702, can function at sample rates that may be integer multiples of the horizontal sync frequency, $F_H$, or at sample rates that are not multiples thereof, as described in the '482 patent at col. 20, line 41-col. 22, line 17.

In an alternative embodiment, the coefficients are retrieved from lookup table 726, as discussed above.

The previous discussion has focused solely on the BTSC compressor and expander portion of a BTSC encoder and decoder. The input to this functionality is the difference (left minus right, or L−R) or SAP signals. In order to fully recover the left and right audio channels at the output of the decoder, a sum (left plus right, or L+R) channel must be processed and transmitted. The processing on this channel is a simple fixed preemphasis filter in the encoder and a reciprocal fixed deemphasis filter in the decoder. A digital implementation of sum channel processing is given in column 17, line 42 through column 18, line 18 of the '482 patent.

The above-described embodiments are given as illustrative examples only. It will be readily appreciated that many deviations may be made from the specific embodiments disclosed in this specification without departing from the invention. Accordingly, the scope of the invention is to be determined by the claims below rather than being limited to the specifically described embodiments above.

What is claimed is:

1. A method for decoding an encoded BTSC composite audio signal comprising:
    digitally separating a L−R signal and a L+R signal, both being encoded in the composite signal;
    digitally applying deemphasis to the L+R signal;
    digitally processing the L−R signal, wherein the step of digitally processing includes computing spectral expansion coefficients and using said coefficients to spectrally expand the L−R signal into a spectrally expanded output signal, wherein the coefficients for spectrally expanding the L−R signal are determined based on a band-limited feed-forward compressed L−R signal, and wherein a reciprocal of the RMS value of the feed-forward signal is used to determine the spectral expansion coefficients; and
    combining the de-emphasized L+R signal with the digitally processed L−R signal to produce separate I, and R audio signals.

2. The method of claim 1 wherein the step of digitally processing includes decimation of the digitally processed L−R signal and the de-emphasized L+R signal.

3. The method of claim 1 wherein the coefficients are computed by interpolating between the reciprocal of the RMS value of the feedforward signal and values retrieved from a lookup table, the lookup table indexed by high order bits of the reciprocal of the RMS feedforward signal.

4. A method for decoding an encoded BTSC composite audio signal comprising:
    digitally separating a L−R signal, a L+R signal and a SAP signal all being encoded in the composite signal;
    digitally applying deemphasis to the L+R signal;
    digitally processing the L−R signal;
    digitally processing the SAP signal, wherein the step of digitally processing the SAP signal includes computing spectral expansion coefficients and using said coefficients to spectrally expand the SAP signal into a spectrally expanded output signal, wherein the coefficients for spectrally expanding 20 the SAP signal are determined based on a feedforward signal, which is based on a band-limited compressed L−R signal, and wherein a reciprocal of the RMS value of the feed-forward signal is used to determine the spectral expansion coefficients; and
    combining the de-emphasized L+R signal with the digitally processed L−R signal to produce separate L and R audio signals.

5. The method of claim 4 wherein the step of digitally processing includes decimation of the digitally processed L−R signal, the de-emphasized L+R signal and the SAP signal.

6. The method of claim 4 wherein the coefficients are computed by interpolating between the reciprocal of the RMS value of the feedforward signal and values retrieved from a lookup table, the lookup table indexed by high order bits of the reciprocal of the RMS feedforward signal.

7. A method for decoding a digital BTSC-compatible stereo television audio signal to generate a left and right audio output signal, the method comprising:
    digitally processing a feedforward portion of the digital BTSC signal at a predetermined sample rate using digitally modeled transfer functions to generate spectral expansion coefficients, the digitally modeled transfer functions being compliant with BTSC standard continuous time transfer functions, wherein the step of digitally processing is accomplished using bilinear transformation of analog transfer functions;
    using the spectral expansion coefficients to expand the digital BTSC signal; and
    using digital modeling techniques to model amplitude and phase characteristics of ideal analog decoder transfer functions.

8. The method of claim 7 further comprising:
    Adjusting the gain of the expanded digital BTSC signal with the reciprocal of the feedforward portion of the digital signal to form a gain adjusted signal; and
    decimating the gain adjusted signal at the predetermined sample rate.

9. The method of claim 7 wherein the digitally modeled amplitude and phase characteristics do not provide phase compensation for non-idealities.

10. The method of claim 7 wherein the step of digital processing includes digitally modeling a BTSC standard variable spectral expansion continuous time update transfer function.

11. The method of claim 7 wherein the step of digitally processing includes digitally modeling a BTSC standard gain control continuous time update algorithm.

12. The method of claim 7 wherein the step of digitally processing includes using an impulse invariance transformation of analog transfer functions.

13. The method of claim 7 wherein the step of digitally processing includes using a digital variable expansion filter controlled by a variable expansion feedforward loop modeled using bilinear transformations of analog transfer functions.

14. The method of claim 7 wherein the step of digitally processing includes using a digital variable expansion filter controlled by a variable expansion feedforward loop modeled using impulse invariance transformation of analog transfer functions.

15. The method of claim 7 wherein the step of digitally processing includes using a digital wideband feedforward gain control bandpass filter modeled using bilinear transformation of analog transfer functions.

16. The method of claim 7 wherein the step of digitally processing includes using a digital wideband feedforward gain control bandpass filter modeled using impulse invariance transformation of analog transfer functions.

17. The method of claim 7 wherein the step of digitally processing includes using a digital wideband feedforward RMS detector.

18. The method of claim 7 wherein the step of digitally processing includes using a digital wideband feedback 1/x function.

19. The method of claim 7 wherein the step of digitally processing includes 20 processing the signal using a digital variable expansion feedforward bandpass filter modeled using the bilinear transformation of analog transfer functions.

20. The method of claim 7 wherein the step of digitally processing includes processing the signal using a digital variable expansion feedforward bandpass filter modeled using the impulse invariance transformation of analog transfer functions.

21. The method of claim 7 wherein the step of digitally processing includes processing the signal using a digital variable expansion feedforward rms detector.

22. The method of claim 7 wherein the method is performed using a digital signal processor.

23. The method of claim 7 wherein the method is performed using an application specific integrated circuit.

24. The method of claim 7 wherein the method is performed using a field programmable gate array.

* * * * *